United States Patent
Upreti

(10) Patent No.: US 7,143,014 B2
(45) Date of Patent: Nov. 28, 2006

(54) SYSTEM AND METHOD OF ANALYZING DISTRIBUTED RC NETWORKS USING NON-UNIFORM SAMPLING OF TRANSFER FUNCTIONS

(75) Inventor: Sanjay Upreti, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 905 days.

(21) Appl. No.: 10/132,101

(22) Filed: Apr. 25, 2002

(65) Prior Publication Data

US 2003/0204387 A1    Oct. 30, 2003

(51) Int. Cl.
*G06F 17/10*    (2006.01)
*G06F 17/50*    (2006.01)

(52) U.S. Cl. .................... 703/2; 703/14; 716/5; 716/18

(58) Field of Classification Search ............... 703/2, 703/13, 14; 716/1, 5, 18; 330/85
See application file for complete search history.

(56) References Cited

U.S. PATENT DOCUMENTS

| | | | | |
|---|---|---|---|---|
| 3,605,032 | A | * | 9/1971 | Kerwin ........................ 330/107 |
| 4,232,269 | A | * | 11/1980 | Willoner ........................ 330/85 |
| 4,864,257 | A | * | 9/1989 | Vandegraaf .................. 332/125 |
| 5,379,231 | A | | 1/1995 | Pillage et al. .................. 703/14 |

OTHER PUBLICATIONS

Yuan et al., Y. Incremental Capacitance Extraction and Its Application to Iterative Timing-Driven Detailed Routing, Proceedings of the 1999 Int. Symposium on Physical Design, Apr. 1999, pp. 42-47.*
Dengi et al., E.A. Hierarchical 2-D Field Solution for Capacitance Extraction for VLSI Interconnect Modeling, Proceedings of the 34th Annual Conference on Design Automation—vol. 00, Jun. 1997, pp. 1-6.*
Van der Meijs et al., N.P. Accurate Interconnect Modeling: Towards Multi-million Transistor Chips as Microwave Circuits, Proceedings of the 1996 IEEE/ACM Int. Conference on Computer-Aided Design, Jan. 1997.*
Cong et al., J. Interconnect Design for Deep Submicron ICs, Proceedings of the 1997 IEEE/ACM Int. Conference on Computer-Aided Design, Nov. 1997, pp. 478-485.*
Carmona et al., M. Modeling of Microsystems with Analog Hardware Description Languages, Sensors and Actuators A: Physical, vol. 26, Aug. 1999, pp. 32-42.*

(Continued)

*Primary Examiner*—Russell Frejd
(74) *Attorney, Agent, or Firm*—Carr LLP; Diana R. Gerhardt

(57) ABSTRACT

A system and method is described for the simulation of the transfer function of very large RC networks of IC chips, such as VLSI. Both the real and imaginary components of the transfer function of RC networks have a property of changing more rapidly at lower frequencies but changing less rapidly at higher frequencies. Methods are employed which interpolate between transfer functions of the RC network for specific frequencies in order to derive an interpolated transfer function of the RC network.

24 Claims, 8 Drawing Sheets

OTHER PUBLICATIONS

Walsh et al.,. E.D. On the Synthesis of Any RC-Realizable Rational Transfer Function Using a Nonuniform RC Distributed Circuit, IEEE Transactions on Circuit Theory, vol. 17, No. 2, May 1979, pp. 217-223.*

Russell Jr. et al., H.T. The Synthesis of Active RC nth-Order Transfer Functions Via a Minimal-Gain Pole and Zero Relocation Scheme, IEEE Transactions on Circuits and Systems, vol. 23, No. 10, Oct. 1976, pp. 609-621.*

Ananda Mohan et al., P.V. Nodal Voltage Simulation of Active RC Networks, IEEE Transactions on Circuits and Systems, vol. 32, No. 10, Oct. 1985, pp. 1085-1088.*

Khoury et al., J.M. Synthesis of Arbitrary Rational Transfer Functions in S Using Uniform Distributed RC Active Circuits, IEEE Transactions on Circuits and Systems, vol. 37, No. 4, Apr. 1990, pp. 464-472.*

* cited by examiner

SYSTEM AND METHOD OF ANALYZING DISTRIBUTED RC NETWORKS USING NON-UNIFORM SAMPLING OF TRANSFER FUNCTIONS

TECHNICAL FIELD

The invention relates generally to circuit simulations, and, more particularly, to simulating the transfer function of a distributed RC network in an integrated circuit ("IC").

BACKGROUND

In IC chip design, there is an ever-increasing push to have a higher number and density of devices, such as transistors, packed inside an IC chip. However, having a higher number and density of devices requires that the IC chip have more "interconnects" as well. The number and importance of interconnects are increasing, due to such factors as timing and noise effects, as the size of devices on the IC chip become smaller. An interconnect is generally defined as a pathway for signals to travel between devices within an IC chip, such as a Very Large Scale Integrated ("VLSI") chip. These interconnects introduce problems into circuits of the IC chip, such as timing mismatches, unfavorably affecting the signal to noise ratio, through the creation of parasitics. These problems must be addressed in the design process of the IC chip.

IC chip designers therefore perform many simulations of the IC chip, such as the VLSI chip, under various input conditions, to check the flow of the signals through the interconnections of the IC chip. These simulations help determine the performance of the circuits in the IC chip and are of prime importance in designing circuits that are best suited and most competitive for a given technology. A VLSI chip, for instance, typically has hundreds of millions of transistors and a similarly large number of interconnects between the transistors. Therefore, the VLSI chip needs a great number of signal flow simulations and variation of parameters to properly model VLSI chip behavior. The analysis of these interconnects has become ever more important, and will become even more so as the density of IC chips continues to increase.

However, the currently available IC chip simulators are unable to handle very large networks comprising resistive and capacitive ("RC") nodes without using excessive computing resources, such as memory and CPU time, while still being able to give an accurate description of a signal flow at an arbitrary input frequency through the RC networks of the IC chip. This inability is of concern, as it causes delays in the ability to bring an IC chip to market. Furthermore, in order to have faster IC chip design and marketing, it is also desired that the IC simulator handle incremental changes to the simulated RC networks, without the necessity of re-simulating the transfer function for the entire RC network. The seriousness of the problem can be gauged by the fact that the IC chip designers may need to perform millions of simulations on these interconnects to get accurate results.

Some tools have been developed to perform interconnect simulation of IC chips. The interconnects are modeled as the resistance and capacitance values of RC nodes ("nodes"). Generally, while various simulation tools are acceptable for certain specific uses, they all have their disadvantages. While some simulation tools perform an acceptable analysis of an input signal propagation through the RC networks of an IC chip, these simulation tools are prohibitively expensive in terms of time and memory required for the simulation. Therefore, these simulation tools cannot be used for the simulation and analysis of large systems of RC networks of IC chips in an acceptable timeframe.

On the other hand, there are simulation tools which are fast and use less memory, but they are not accurate enough to meet demands of the current and future technologies. These simulation tools are generally based on techniques for the reduction of the transfer function of the RC network to a simpler mathematical model. Some examples of such reduction tools are Rapid Interconnect Circuit Evaluation ("RICE") and Asymptotic Waveform Evaluation ("AWE"). Hence, if a particular node of the RC network changes its characteristics, the reduction of the entire RC network needs to be performed again. For example, if the resistance or capacitance of a particular node are modified, the entire simulated RC network must be recalculated. Further, the reduction of the network is based on the single frequency characteristics of the input signal, not a plurality of potentially desired input signals.

Some general purpose circuit simulation tools do exist, such as SPICE™ and ACES™ that try to optimize speed, memory usage, and accuracy. However, these general purpose circuit simulation tools are too generic, and therefore do not focus exclusively on RC network analysis, such as is found when simulating IC chips. The tools also fail to deliver the necessary processing capacity in a timely and efficient manner. Accordingly, these general purpose circuit simulations fail to provide practical solutions for designing IC chips.

Therefore, there is a need for an RC network simulator that overcomes the shortcomings of existing simulators.

SUMMARY

These and other disadvantages are overcome by the system and a method of the present invention which stores information in each of the nodes of a simulated RC network.

In another aspect of the invention, the system and method generate and employ normalized frequencies associated with the sampling of transfer functions.

In yet another aspect, the system and method chooses a path starting from a modified node to an input node.

In yet another aspect, the system and method employs a POP to calculate for incremental changes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise. In a further preferred embodiment, the computer program is embodied upon or within a computer program product, such as a floppy disk or compact disk, or other storage medium.

Figure 1:
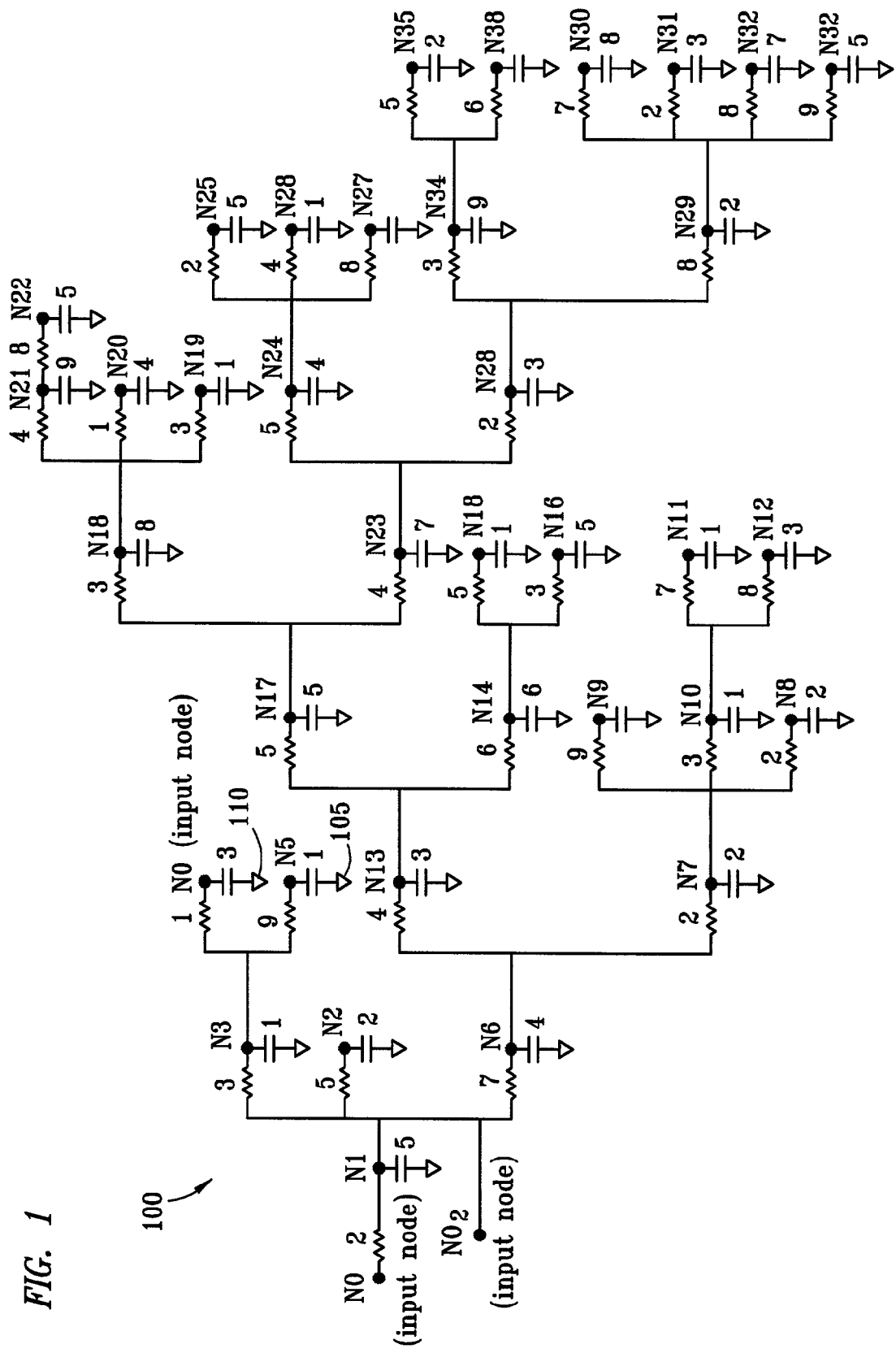
FIG. 1 depicts an exemplary distributed RC network employed in IC chip design.

Referring to FIG. 1, an exemplary RC network 100 of an IC chip is shown. The RC network 100 comprises various nodes, such as N3, N4 and N5, connected to each other with a resistor, such as resistor $R_1$ and resistor $R_3$. The RC network 100 further comprises capacitors to ground, such as capacitor C1 from nodes N4 and N5 and ground 105, 110. In a further embodiment, the RC network 100, the ground 105, 110 are electrical grounds. For the purposes of clarity and conciseness, a single input node N0 and multiple output nodes, such as N35, N36, N30, and so on, are illustrated. However, due to the linearity of the system 100, in an alternative embodiment, multiple input nodes N0, $N0_2$ with multiple output nodes can be analyzed.

Figure 2A:
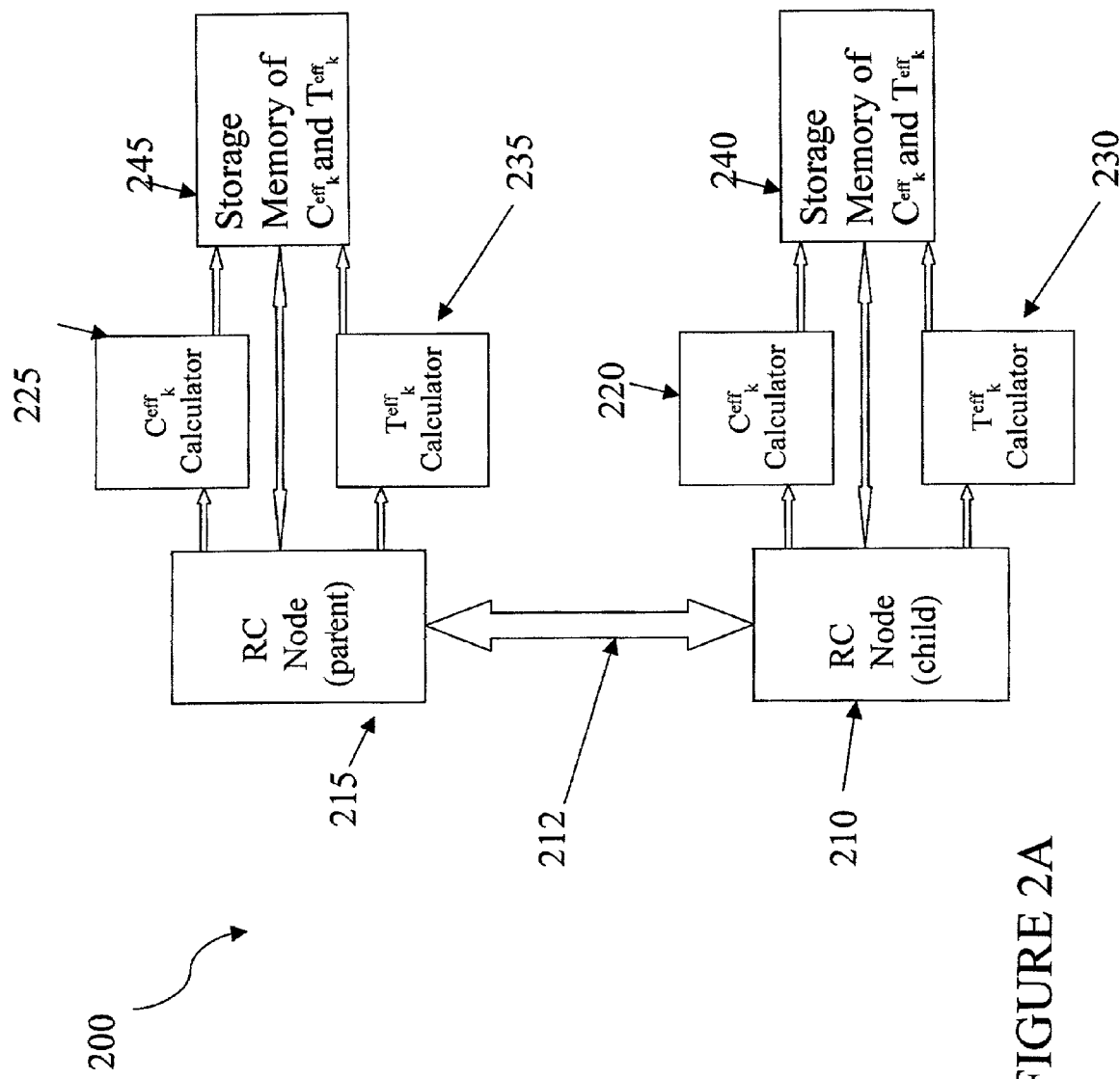
FIG. 2A depicts a system for storing Frequency Domain Transfer Functions ("FDTFs") on multiple nodes of a simulated RC network.

Turning to FIG. 2A, disclosed is an FDTF storage system 200. Generally, the system 200 calculates the "effective transfer function" ("$T^{\mathit{eff}}$") and an "effective capacitance" ("$C^{\mathit{eff}}$") for a specified node. The system 200 stores the $T^{\mathit{eff}}$ and $C^{\mathit{eff}}$ values in a memory associated with the specified node. In a further embodiment, the calculation of the transfer function and effective capacitance values of the specified node is reiterated for different input frequencies.

The system 200 has a parent node 215 operationally coupled through a branch 212 to a child node 210. Both the parent node 215 and the child node 210 have directly connected resistances and have respective capacitances to ground. For instance, the child node N30 of FIG. 1 is directly connected to a parent node N29 through a resistance of 7 ohms. This resistance is the resistance $R_{30}$, which is between the child node N30 and its parent, node N29. The child node N30 also has a capacitor to ground which has a capacitance of 6 picofarads. This capacitance is the capacitance $C_{30}$, which is between the child RC node N30 and ground. The parent node N29 of child node N30 are connected through a resistor which has a resistance to its parent node of $R_{29}$. The $R_{29}$ value is 8 ohms. The capacitance value of the capacitance between node N29 and ground, $C_{29}$, is 3 picofarads. In FIG. 1, although node N29 is the parent node to node N30, node N29 is also the child node to node N28, node N28 is the child node of node N23, and so on. Each node $N_k$ of the RC network 100 also has both effective capacitance $C^{\mathit{eff}}_k$ and an effective transfer function $T^{\mathit{eff}}_k$ associated with it.

Returning to FIG. 2A, the effective capacitance and transfer function values are calculated for the child node 210 by the $C^{\mathit{eff}}_k$ calculator 220 and the $T^{\mathit{eff}}_k$ calculator 230, and then stored in an associated memory cell 240. The effective capacitance and transfer function values are then also calculated for the parent RC node 215 by the $C^{\mathit{eff}}_k$ calculator 225 and the $T^{\mathit{eff}}_k$ calculator 235, and are stored in an associated memory cell 245.

Generally, for any node $N_k$ in an RC network, $C^{\mathit{eff}}_k$ and $T^{\mathit{eff}}_k$ can be calculated using the following equations, where "$M_k$" is the number of first generation child nodes that a given parent RC node $N_k$ has, and $C^{\mathit{eff}}_k$ and $T^{\mathit{eff}}_k$ are the $C^{\mathit{eff}}$ and the $T^{\mathit{eff}}$ values of those "1 to $M_k$" child nodes, and s is the complex applied input signal frequency:

$$C^{\mathit{eff}}_k = C_k + \phi_{n=1}^{M_k} C^{\mathit{eff}}_n \times T^{\mathit{eff}}_n \qquad (1)$$

$$T^{\mathit{eff}}_k = \frac{1}{1 + s R_k C^{\mathit{eff}}_k} \qquad (2)$$

The values $C^{\mathit{eff}}_k$ and $T^{\mathit{eff}}_k$ are calculated for each node $N_k$ in the system 200 as nodes are added from the ultimate output, or "leaf," nodes, to the final input node.

According to the definition of "$M_k$" given for Equation (1), $M_k$ equals "0" for any leaf node. There are no $C^{\mathit{eff}}$ or $T^{\mathit{eff}}$ values for any child nodes of any leaf nodes, since by definition a leaf node is not operationally coupled directly to another leaf node. This means that the sum of the products within Equation (1) for a leaf node necessarily equals zero, and the $C^{\mathit{eff}}$ for any leaf node is the same as the capacitance to ground of that leaf node. Also, from Equation (2), the $T^{\mathit{eff}}$ for any leaf node is a function of the frequency signal applied to the leaf node, the resistance $R_k$ between the leaf node and its parent and capacitor to ground, without being a function of the $C^{\mathit{eff}}$ and $T^{\mathit{eff}}$ values of any child nodes.

However, according to Equation (1), the $C^{\mathit{eff}}$ value of a parent node is the sum of the $C^{\mathit{eff}}$ value multiplied by the $T^{\mathit{eff}}$ value of each of the individual child nodes, as well as the capacitance to ground of the parent node. For example, the $C^{\mathit{eff}}$ of the parent node N29 of FIG. 1 is equal to the sum of the $C^{\mathit{eff}}$ value multiplied by the $T^{\mathit{eff}}$ value of every child node, N30 through N33, added to the capacitor to ground, 2 picofarads, of the parent node N29. The $T^{\mathit{eff}}$ value of the parent node N29 is then calculated through the employment of Equation (2), which employs the $C^{\mathit{eff}}$ value calculated for parent node N29 in Equation (1).

The $C^{\mathit{eff}}$, and hence $T^{\mathit{eff}}$, values for each node is therefore a function of the $C^{\mathit{eff}}$ and $T^{\mathit{eff}}$ values of its first generation child nodes. For instance, the $C^{\mathit{eff}}$ value of a parent node N26 is the sum of each of the effective $C^{\mathit{eff}}$ values multiplied by $T^{\mathit{eff}}$ values of nodes N29 and N34, added to the capacitance to ground value of Node 26, that of 3 picofarads. Likewise, the $C^{\mathit{eff}}$ value of Node N23 is the sum of each of the effective $C^{\mathit{eff}}$ values multiplied by $T^{\mathit{eff}}$ values of nodes N26 and N24, added to the directly coupled capacitance value of Node 24, that of 7 picofarads, and so on. These calculations occur for each node $N_k$ of the RC network 100 from a given leaf node to the input node.

Figure 3:
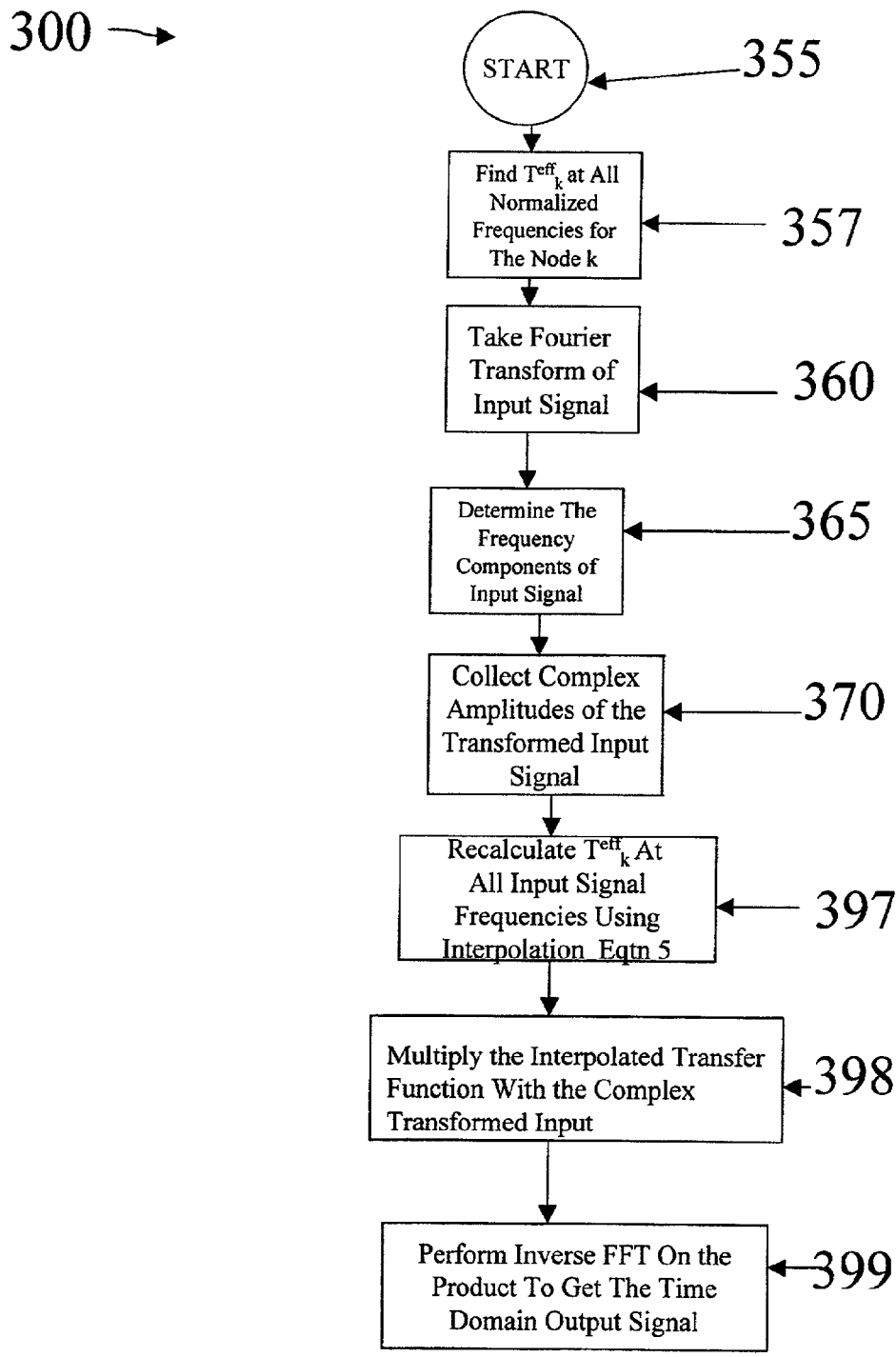
FIG. 3 depicts a method for interpolating transfer functions and calculating the corresponding time domain output signal for a simulated RC network.

Returning to FIG. 2A, in one embodiment, the $C^{eff}_k$ calculators 220, 225 and the $T^{eff}_k$ calculators 230, 235 of system 200 are employed to calculate $C^{eff}_k$ and $T^{eff}_k$ at a plurality of chosen input signal frequencies, such as GSTF frequency values calculated by the method 300 illustrated in FIG. 3. In the system 200, normalized frequencies calculated by the method 250 are employed by the $C^{eff}_k$ calculators 220, 225 and the $T^{eff}_k$ calculators 230, 235. The associated $T^{eff}$ and $C^{eff}$ values, which are a function of the plurality of these chosen input frequencies, are then stored in one or more memory cells 240, 245.

Figure 2B:
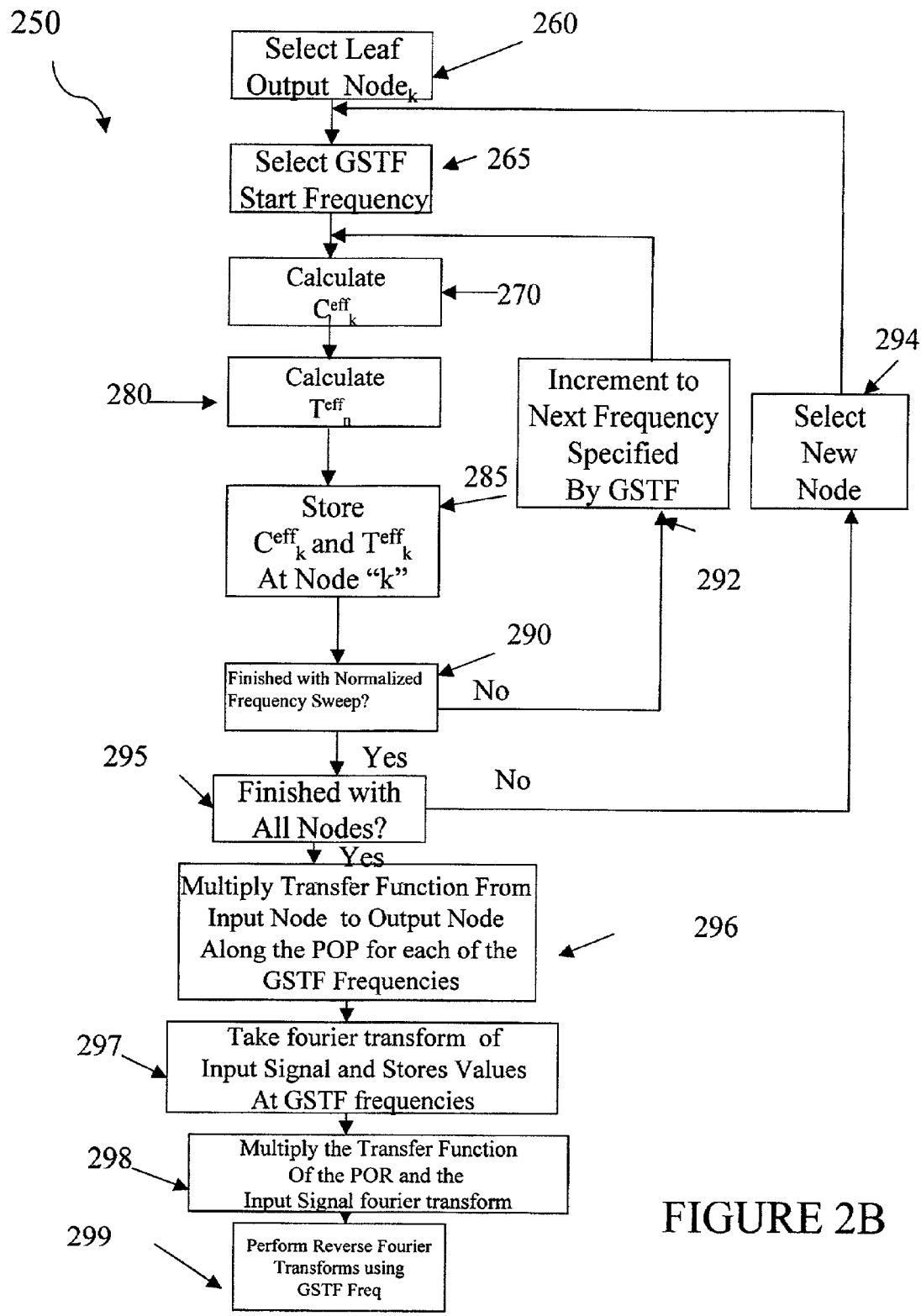
FIG. 2B depicts a method for storing FDTFs on multiple nodes of a simulated RC network at a plurality of normalized input frequencies.

Turning now to FIG. 2B, disclosed is a method 250 for storing $C^{eff}$ and $T^{eff}$ values of the nodes in the RC network 100 for a plurality of input frequencies, and then calculating the time and frequency response of the network associated at a plurality of input frequencies.

In step 260, a leaf output node k is selected. In step 265, the lowest frequency input signal of one of a set of previously calculated and stored frequency values j☐ is selected. The set of frequencies have been chosen by such methods as the GSTF method disclosed in FIG. 4. In an alternative embodiment, the highest frequency signal of one of the set of chosen input frequency signals j☐ is selected.

In step 270, $C^{eff}_k$ is calculated for the selected node. $C^{eff}_k$ is calculated, as demonstrated by Equation (1) at a selected GSTF frequency j☐. Similarly, in step 280, $T^{eff}_k$ is calculated for the selected node at the selected GSTF frequency, as demonstrated by Equation (2) at the selected GSTF frequency j☐. In step 285, the $C^{eff}_k$ and $T^{eff}_k$ values of the selected node $n_k$ are then stored in a data structure for node $n_k$.

In step 290, the method 250 determines if all of the selected GSTF frequencies j☐ have been employed to determine the $C^{eff}_k$ and $T^{eff}_k$ values of the selected node k at the selected GSTF frequencies. If all of the selected GSTF frequencies have not been employed to determine all of the $C^{eff}_k$ and $T^{eff}_k$ values of the node k, then step 292 is executed, and the input signal is incremented to the next normalized GSTF frequency selected by the method 400. Then, the $C^{eff}_k$ value is recalculated in a step 270 for the new selected normalized input frequency, the $T^{eff}_k$ value is recalculated in step 280 for the new selected input frequency structure to node k, another set of $C^{eff}_k$ and $T^{eff}_k$ values are stored in the node n in step 285 corresponding to the new GSTF normalized frequency j☐, and so on.

If all of the frequency values calculated by the GSTF method 400 have been employed by the method 250, then in step 295, the method 250 determines if the node k that the method 300 previously selected is actually the input node. If node k is not the input node, then the method 250 selects a new node k to analyze. The selection of a new node is made in compliance with constraints of Equations (1) and (2). In one embodiment, the selection of the new node occurs when executing method 500. Whichever new node is selected in step 298, an appropriate GSTF starting input frequency is again selected in step 265, and steps 270 through 295 are executed again as appropriate.

However, if step 295 determines that node k is the input node, then step 296 multiplies the transfer function form the chosen input node to the output node along the POP for each of the GSTF frequencies when applying an input signal of a specific frequency to the input node.

Specifically, the frequency spectrum of the transformed input, $V_k$, at the output node, denoted as k, yields the following for a given GSTF frequency(f):

$$V_k(f)=[T^{eff}_k \times T^{eff}_{k-1} \times T^{eff}_{k-2} \times \ldots T^{eff}_1]V_{in} \qquad (3)$$

where 1, 2, ... k are the indices of the nodes along the path from the input node ($N_1$) to the $k_{th}$ output node ($N_k$) and $T^{eff}_k$ is the effective transfer function at the output node k.

In step 297, the method 250 takes the Fourier Transform of the input signal, and stores this at the GSTF frequencies. In step 298, the method 250 multiplies the transfer function of the POP and the Fourier Transform of the input signal.

In step 299, the time-domain response from the input node to the output node is then calculated for the selected normalized frequencies by the employment of the GSTF method 250. In order to get the time domain $v_k(t)$ signal from the output node k, step 299 calculates the inverse Fast Fourier Transform ("FFT") of the signal $V_k(f)$:

$$v_k(t)=FFT^{-1}(V_k(f)) \qquad (4)$$

Step 299 calculates the time domain response for the RC network at the selected input frequencies.

In a further embodiment of the method 250, the imaginary component of $V_k(t)$ is not calculated, and only the real component of $V_k(t)$ is calculated. For instance, if the sample rate of the input frequency is at $10^{12}$ Hertz, if the FFT has 1024 samples, and if the resistor from the Kth node to its parent was of the order of 10 ohms, and the capacitance to ground was on the order of 10 femtofarads, as is typically the case in VLSI RC network simulation, the product of $j\omega RC$ is of the order of $10^{-2}$, which is substantially smaller than "1," as illustrated in Equation 2. Thus, within one percent of accuracy, step 294 simplifies Equation 2. Typically, for most analyses in the GigaHertz range, 1 picosecond time between samples will suffice, which corresponds to 1 terrahertz sampling rate, which is more than enough to perform relevant calculations.

Turning now to FIG. 3, disclosed is a method 300 for interpolating transfer functions and then converting the interpolated transfer functions into the time domain. Due to the relative rates of change of the real and imaginary components of a transfer function over a normalized input signal frequency spectra, the transfer functions of an RC network, such as the exemplary RC network 100, may be approximated at any frequency within the normalized frequency range through performing an interpolation between the two closest sampling frequencies. In one embodiment, the interpolation performed is a linear interpolation. In yet another embodiment, the interpolation is a non-linear interpolation, such as a polynomial interpolation like Spline, LaGrange polynomial, and so on.

After starting in step 355, in step 357, the method 350 finds $T^{eff}_k$ for all the normalized frequencies for the Node k. In step 360, a Fourier Transform of the input signal is performed. Then, in step 365, the method 300 determines the frequency components of the input signal, as determined by the Fourier Transform. In step 370, the method 350 collects the amplitudes of the Fourier Transformed input signal.

In step 397, an interpolation of the transfer function of the RC network 100 is calculated by interpolating the $T^{eff}_k$ of each node k at all the input frequencies using values at GSTF frequencies. In the method 300, step 397 linearly interpolates through the linear interpolation formula:

$$y_i=y_0+(x_i-x_0)\{(y_1-y_0)/(x_1-x_0)\} \qquad (5)$$

where $x_0<x_i<x_1$ and $y_0<y_i<y_1$.

In Equation (5), $x_0$ generally corresponds to a lower selected normalized frequency than the desired frequency, $x_i$ corresponds to the desired signal input normalized frequency for employment in calculation of the desired transfer function, and $x_1$ corresponds to a higher selected normalized frequency than the desired signal input frequency $x_i$. In equation (5), $y_0$ generally represents the $T^{eff}_k$ of node k at the corresponding $x_0$, $y_i$ represents the corresponding $T^{eff}_k$ of $x_i$, and $y_1$ represents the corresponding $T^{eff}_k$ of $x_1$. However, those of ordinary skill in the art will understand that other approaches to interpolation may be employed by the interpolator 397 as well.

In step 398, the method 300 multiplies the interpolated transfer function with the complex, Fourier Transformed input. In step 399, the method 300 converts the interpolated transfer function, $V_k(f)$ of the interpolated normalized frequency, into the time domain, $V_k(t)$ through the use of an inverse FFT, in a manner to and for similar reasons as step 299 of method 250. Therefore, method 300 can advantageously calculate an approximated transfer function for any normalized frequency value from zero to the highest frequency chosen by method 400.

Figure 4A:
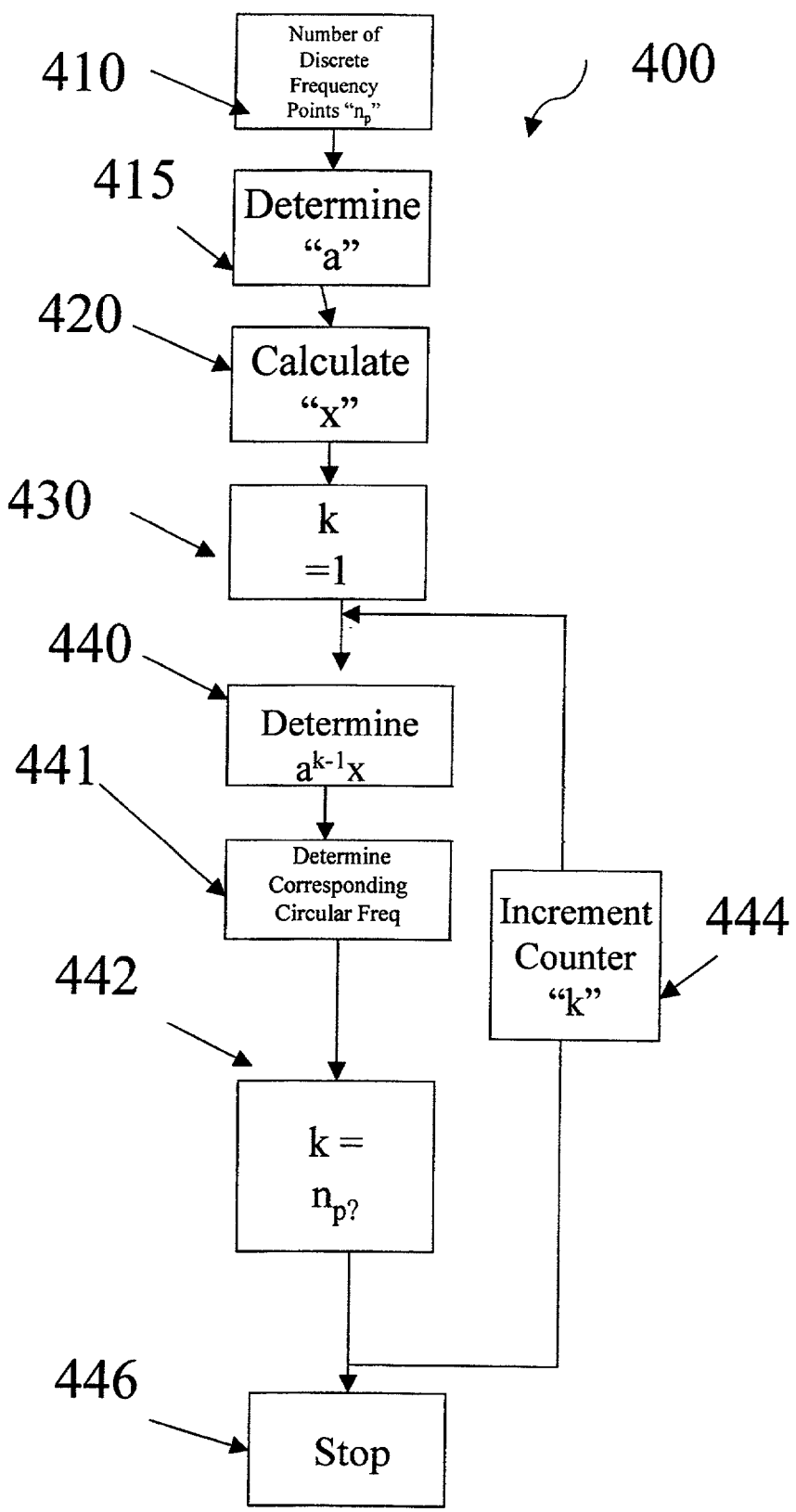
FIG. 4A depicts a method of generating and employing empirical equations for the creation of geometric sampling of transfer functions ("GSTFs")

Turning now to FIG. 4A, disclosed is the GTSF method 400 of generating equations for GSTFs in the frequency domain. Generally, the method 400 selects specific normalized frequencies, from zero to a previously determined highest frequency, based upon relevant criteria, and then forwards these frequencies to the method 200 for employment in step 265 or step 292. In one embodiment of the method 400, the normalized set of frequencies of an input signal ranges from 0 to Π, for reasons to be detailed below. In one embodiment, the determined highest frequency, before normalization, is the sampling frequency of the input signal multiplied by Ł.

Figure 4B:
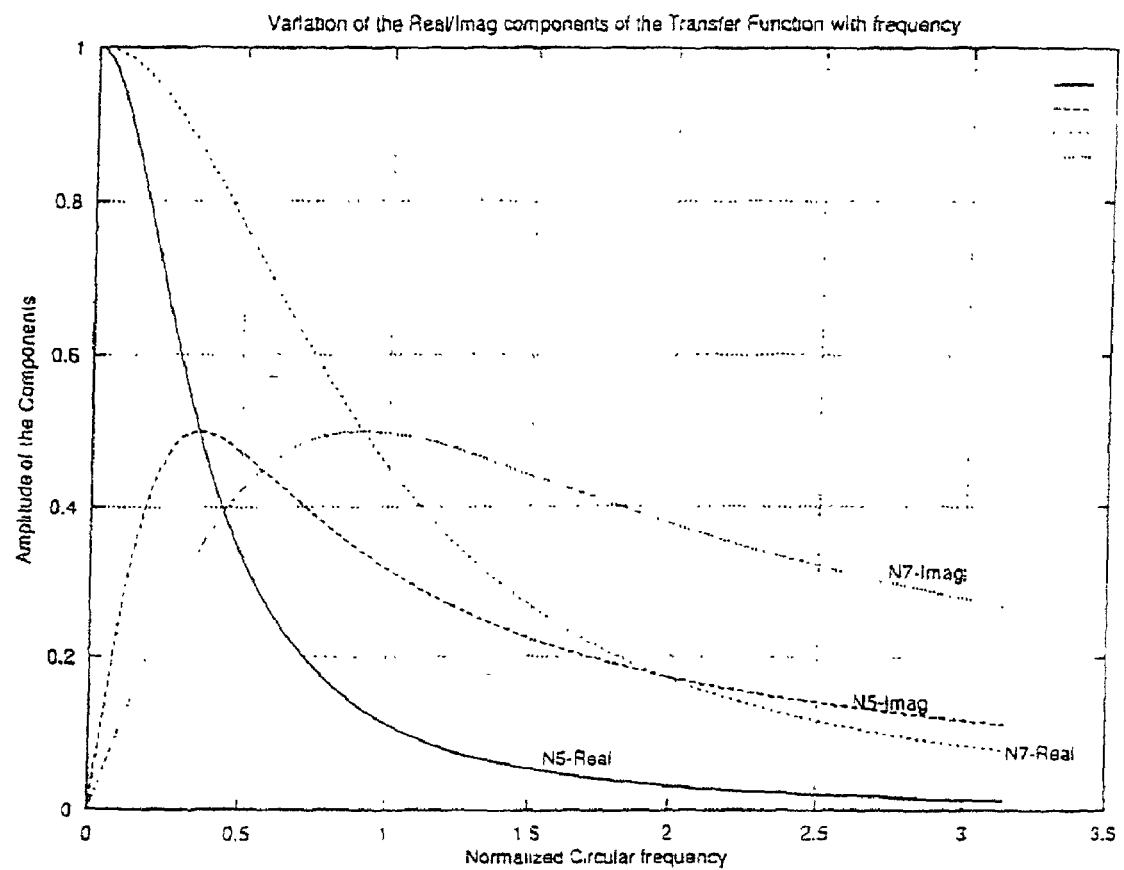
FIG. 4B depicts variations of Real and Imaginary components of transfer functions at two different nodes of an RC network.

Turning briefly to FIG. 4B, disclosed are the variations of the Real and Imaginary parts of the transfer function, at two different nodes of an exemplary RC network. One characteristic of the transfer function of Equation (2), is that for any linear circuit with distributed RCs, the real and imaginary parts have steep gradients at low frequencies (except at f=0; that is, there is DC voltage where the real part of the transfer function is stationary and unity and the imaginary part is zero), while their variation at high frequencies is very slow, vanishing asymptotically. This is demonstrated graphically in FIG. 4B.

Returning to FIG. 4A, the method 400 therefore generally utilizes these differing rates of change of both the Real and the Imaginary parts of a transfer function at the different normalized frequencies, as demonstrated in FIG. 4B. Specifically, in the method 400, the sampling intervals, $\Delta f_k$, of a calculated transfer function is a nonlinear function of the various sample points, and is generally defined by the following logical sequence (x to be calculated below):

$$a^0 x, a^1 x, a^2 x, a^3 x, a^4 x \ldots a^{n-1} x \quad (6)$$

In step 410, the number of frequency points for use in calculating $C^{eff}_k$ and $T^{eff}_k$ is determined. In one embodiment, the number of frequency points is 32, but those of ordinary skill in the art understand that the present invention is not constrained to 32 frequency points, and may instead employ any number of appropriate frequency points.

In step 415, a value for α is chosen or determined. The value of α that is chosen by the step 415 has a value that is substantially close to the value one. In one embodiment, α=1.1. In a second embodiment, α=1.2. In a third embodiment, α=1.25. In a further embodiment, α is a value ranging from 1.10 to 1.30. Those of ordinary skill in the art will understand that there may be other appropriate values as well.

In step 420, the value of x is derived. To determine what x must be for a given a, the sum of the frequency intervals represented by the sum of the elements of Equation (6) is to be equal to the maximum sampling frequency, that is:

$$\phi_{k=0}^{n-1} \Delta f_k = f_{max} = B/t_s \quad (7)$$

where $t_s$ is the time domain sampling interval for the simulated RC network 100.

Therefore, for the number of frequency points, the following formula is therefore derived:

$$\phi_{k=0}^{n-1} x \, a^k = x[\phi_{k=0}^{n-1} a^k] = B/t_s \quad (8)$$

$$\text{Therefore, } x = \frac{A}{(t_s[\varphi_{k=0}^{n-1} a^k])} \quad (9)$$

Therefore, in step 420, x is calculated as a function of both the a value chosen, the time domain sampling interval of the input signal, and the number of data points to be sampled.

In step 430, a "count," such as k, is initialized to the value of one. K is the number of iterations GTSF method 400 has performed. K shall have a value between one to the total number of frequency points to be sampled, n, depending upon how may iterations the method 400 has performed.

In step 440, a normalized frequency interval is calculated and stored. The normalized interval is a function of $a^{k-1} x$.

In step 441, a normalized frequency is derived. Typically, the normalized frequency for a given count value is a function of the sum of all previous normalized frequency intervals.

In step 442, the method 400 determines whether the value of count is equal to the number of normalized frequency points to be sampled. If the value of k is not equal, k is incremented in step 444, step 440 is executed again, and so on. If the value of k equals the number of normalized frequency points to be sampled, then method 400 stops in step 446.

Figure 5:
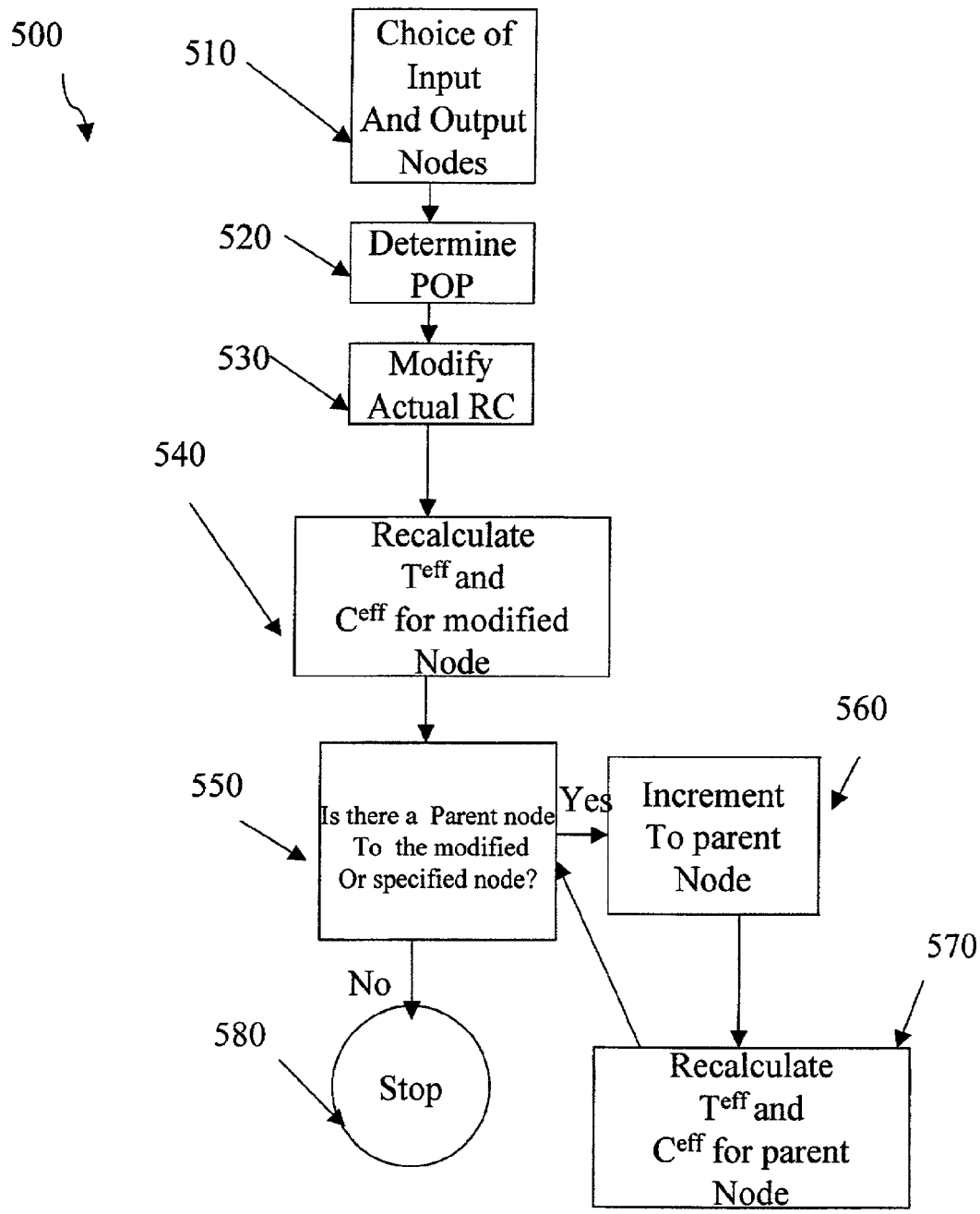
FIG. 5 depicts a method of generating and employing a Parent-Only-Path ("POP") for recalculating the GSTFs from modified nodes to root nodes.

Turning now to FIG. 5, disclosed is a method 500 for calculating a POP when modifying a node that includes the input node, the output node, or a node directly between an input node and an output node, in a distributed simulated RC network. In a simulated RC network, such as the simulated version of the exemplary RC network 100, each node stores the complex quantities $C^{eff}$ and $T^{eff}$ for the normalized frequencies, as calculated in the method 400. Generally, in deriving a POP, when the resistive or capacitive values of a node of an RC network are modified, it is only necessary to recalculate the $C^{eff}$ and $T^{eff}$ values of the modified node and to recalculate the $C^{eff}$ and $T^{eff}$ values of the direct line of parent nodes between the modified node and up to and including the input node. Only recalculating the $C^{eff}$ and $T^{eff}$ values from the changed node of the POP to the input node is advantageous, in that the recalculations necessary to derive the new transfer function are significantly less than what is required by conventional systems, as in conventional systems, even those nodes which were not effected by the change in resistive and capacitive values had to be recalculated.

In step 510, an input and output node is chosen. In step 520, a POP, comprising the direct path of nodes from the chosen input node to the chosen output node, is calculated.

In step 530, the directly coupled resistance or capacitance value of a node within the POP are modified.

In step 540, the $C^{\textit{eff}}$ and $T^{\textit{eff}}$ values for the modified node are recalculated, according to Equations (1) and (2). This entails the modified or otherwise selected node employing the $C^{\textit{eff}}$ and $T^{\textit{eff}}$ values of any child nodes. If any child node is not in the POP, advantageously, the $C^{\textit{eff}}$ and $T^{\textit{eff}}$ values for that child node need not be recalculated.

Step 550 determines if either the modified or otherwise selected node has a parent node. If the node in question has no parent, then step 580 is executed, and the method 500 terminates. If the node has a parent node, then in step 560, the $C^{\textit{eff}}$ and $T^{\textit{eff}}$ values of the parent node are recalculated in step 570, using the recalculated $C^{\textit{eff}}$ and $T^{\textit{eff}}$ values of the previously selected node, now a child node, as well as all of the other unchanged child nodes of the new parent nodes.

After step 570, step 550 is re-executed. If the newly selected node has a parent node (that is, if the modified node has a grandparent's node), then in step 560, the $C^{\textit{eff}}$ and $T^{\textit{eff}}$ values of the grandparent node are recalculated, using the recalculated $C^{\textit{eff}}$ and $T^{\textit{eff}}$ values of the parent node. This loop is repeated up to and including the input node.

Figure 6:
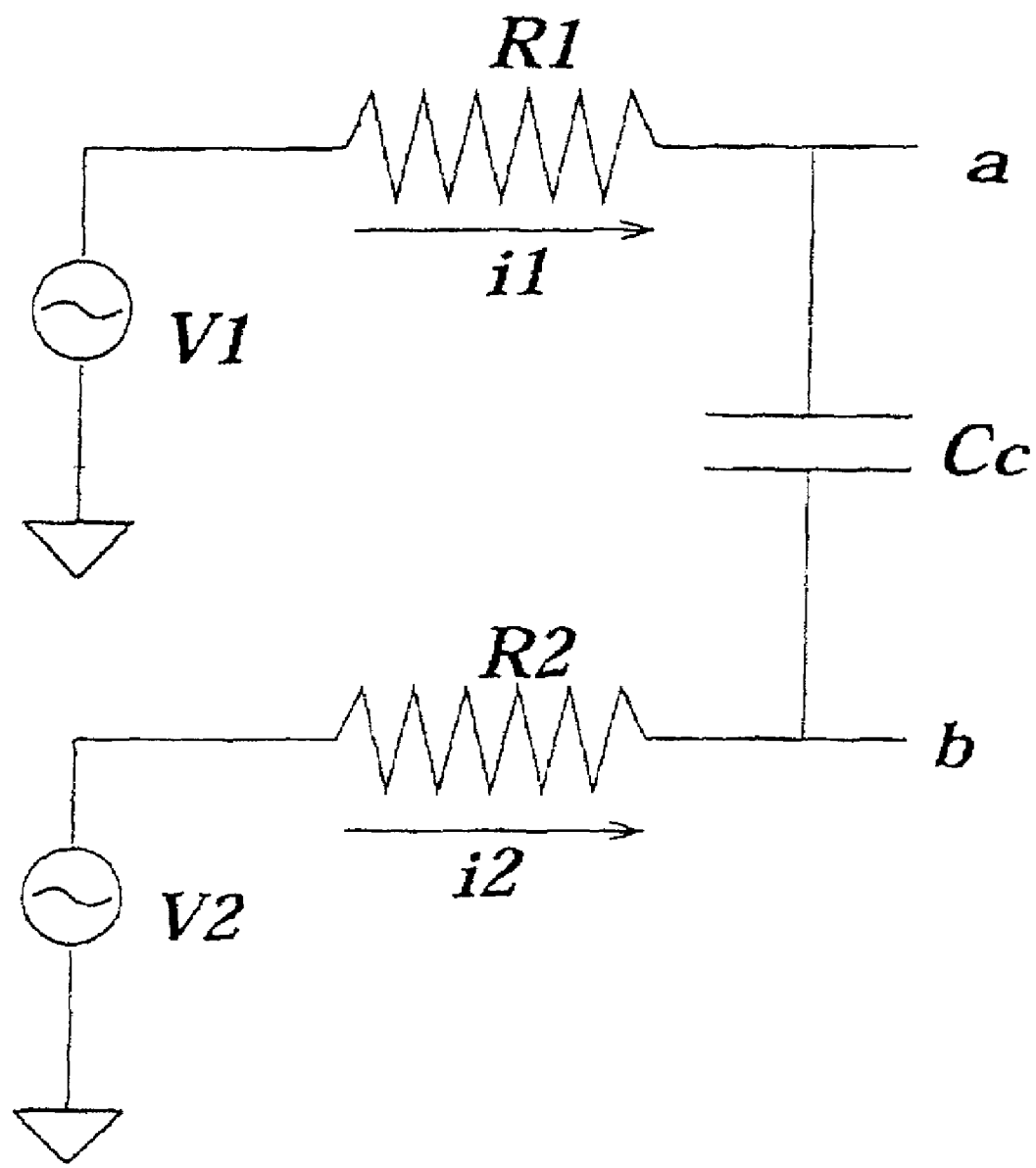
FIG. 6 depicts a further embodiment of an exemplary RC network comprising a coupling capacitor.

Turning now to FIG. 6, disclosed is an embodiment of an exemplary coupled capacitor circuit 600. A coupled capacitor is generally defined as a capacitance between two active nodes, not including ground. A transfer function for the exemplary coupled capacitor circuit 600, and the corresponding time domain response for the exemplary coupling capacitor circuit 600, will be derived below. The exemplary coupling capacitor circuit 600 is a specific RC network that will be in part analyzed below by the method 250.

Generally, in the exemplary coupling capacitor circuit 600, the voltage equation, due to the source $v_1$, has this form:

$$v_1 = i_1 R_1 + q_1/C + i_1 R_2 \qquad (10)$$

In the frequency domain (uppercase letters represent Fourier transforms of their lowercase equivalents), Equation (9) reduces to:

$$-jTV_1 = (R_1+R_2)(-jTI_1) + (1/C)I_1 = (-jTR + 1/C)I_1$$

This implies:

$$I_1 = -\frac{(jTRC)(V_1/R)}{(1-jTRC)}, \qquad (11)$$

$$I_2 = -\frac{(jTRC)(V_2/R)}{(1-jTRC)}, \qquad (12)$$

where $$R = R_1 + R_2$$

The total current at any instant within the exemplary coupling capacitor circuit 600 will be given by the expression, when $\mathbb{V}=\Box RC$:

$$I=(V/R)\{(1/(1-j\mathbb{V}))-1)\}, \text{ where } V=V_2-V_1$$

In one embodiment, when the method 250 is employed to analyze the exemplary coupling capacitor circuit 600, step 298 outputs the transfer function, for the output nodes a and b (in Frequency Domain format), as:

Node $A = V_1 - (R_1/R)\{V/(1-j\mathbb{V})\} + VR_1/R =$
$\qquad V_1[1 + R_1/R(j\mathbb{V}/(1-j\mathbb{V}))] + V_2R_1/R\{j\mathbb{V}/(1-j\mathbb{V})\}$ Node $B = V_2 - (R_2/R)\{V/(1-j\mathbb{V})) + VR_2/R =$
$\qquad V_2[1 + R_2/R(j\mathbb{V}/(1-j\mathbb{V}))] + V_1R_2/R\{j\mathbb{V}/(1-j\mathbb{V})\}$ Then, step 299 of method 250 performs the inverse FFT, and derives the following time-domain expressions:

$$a = v_0 + (R_1/R)(v_1-v_2)e^{-t/\theta}$$

and $$b = v_0 + (R_2/R)(v_1-v_2)e^{-t/\theta} \qquad (13)$$

where $v_0=(v_1 R_2 + v_2 R_1)/(R_1+R_2)$ and $\theta=RC$.

Assuming $v_1$ and $v_2$ have upper and lower bounds of 0 and 1, under certain circumstances, the output voltage at nodes a and b can exceed 1 or go below 0, due such factors as the significance of noise, timing and power analysis. These are coupling effects which are of particular interest in IC simulation due to their significance in noise, timing and power analysis. The reason for this behavior is a property of a coupling capacitor, which lets the high frequency components through between nodes a and b. So, the coupling effects are typically only visible when either $v_1$ or $v_2$ are switching their states.

Empirical data has been obtained concerning the amount of time and memory used to run the necessary calculations for determining the time domain response for a given RC network. The number of RC nodes within a simulated RC network ranges from 1 k (1024) R and C pairs to as many as 128 k (128×1024) R and C pairs. The memory and time to determine the transfer functions and their corresponding time-domain function of the networks employing method 250 is compared to the amount of time and memory used in PowerSPICE™. The following table summarizes the comparison between PowerSPICE™ and method 250.

TABLE 1

Results of Comparisons

| Pairs, of RCs | PowerSPICE™ Time | PowerSPICE™ Memory | GSTF Time | GSTF Memory |
|---|---|---|---|---|
| 1k | 2 s | 9 MB | 50 ms | 1 MB |
| 2k | 4 s | 13 MB | 110 ms | 2 MB |
| 4k | 9 s | 23 MB | 180 ms | 3 MB |
| 8k | 30 s | 43 MB | 390 ms | 7 MB |
| 16k | 1.8 m | 85 MB | 740 ms | 14 MB |
| 32k | 7.5 m | 175 MB | 1.56 s | 28 MB |
| 64k | 30.0 m | 400 MB | 3.07 s | 56 MB |
| 128k | 2.0 h | 900 MB | 6.50 s | 111 MB |

(ms = milliseconds, s = seconds, m = minutes, h = hours, MB = Million Bytes)

As can be seen, the differences in time and processing speed are substantial.

It is understood that the present invention can take many forms and embodiments. Accordingly, several variations may be made in the foregoing without departing from the spirit or the scope of the invention.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of preferred embodiments. Accordingly, it is appropriate that the appended claims be construed broadly and in a manner consistent with the scope of the invention.

The invention claimed is:

1. A system for storing quantities in a node or nodes of RC nodes of a simulated RC network of an IC chip, the system comprising:
    a selected RC node of a simulated RC network;
    an effective capacitance calculator for the selected RC node, wherein the effective capacitance is calculated through the employment of one or more transfer functions, wherein the one or more transfer functions are a function of a geometric sampling;
    an effective transfer function calculator for the selected RC node, wherein the effective transfer function is calculated through the employment of the effective capacitance of the selected node; and
    a storage memory associated with the selected RC node wherein the effective capacitance and effective transfer function values are stored.

2. The system of claim 1, wherein the IC chip is a VLSI chip.

3. The system of claim 1, wherein a transfer function of the simulated RC network comprises a transfer function for a coupled capacitor.

4. The system of claim 1, wherein the selected RC node is a parent RC node, and the effective capacitance and the effective transfer function values of the parent RC node are modified by the effective capacitance and the effective transfer function values of one or more operationally coupled child RC nodes.

5. The system of claim 1, wherein the simulated RC network comprises a hierarchy of parent RC nodes and of child RC nodes.

6. The system of claim 1, wherein the effective capacitance and the effective transfer function values of the selected RC node are calculated for a plurality of frequencies.

7. A computer-implemented method for calculating and employing a plurality of transfer functions for a simulated RC network of an IC chip, the method comprising:
    determining a count of normalized frequency points;
    calculating a normalized frequency interval between two of the normalized frequency points;
    calculating the normalized frequencies corresponding to the associated normalized frequency intervals;
    employing two of the plurality of normalized frequencies to determine a transfer function of the simulated RC network; and
    storing the transfer function of the simulated RC network.

8. The method of claim 7, further comprising a step of interpolation, wherein the transfer function of the simulated RC network is interpolated between the two of the plurality of normalized frequencies.

9. The method of claim 8, wherein the interpolation comprises a linear interpolation.

10. The method of claim 8, wherein the interpolation comprises a non-linear interpolation.

11. The method of claim 7, wherein the normalized frequency interval between each normalized frequency point is a function of an exponential.

12. The method of claim 7, wherein the count of normalized frequency points is 32.

13. The method of claim 7, wherein an effective transfer function and an effective capacitance value for a selected RC node of the simulated RC network are employed to determine the transfer function of the simulated RC network.

14. The method of claim 7, wherein the transfer function of the RC network is transformed into a time-domain signal.

15. The method of claim 7, wherein the transfer function of the RC network comprises a transfer function for coupled capacitors.

16. The method of claim 7, wherein an effective capacitance and an effective transfer function values of a selected RC node of the simulated RC network are calculated for a plurality of selected normalized frequencies.

17. A computer-implemented method for employing a Parent-Only-Path (POP) to calculate for incremental changes in a simulated RC network of an integrated circuit chip, the method comprising:
    choosing an input node and an output node to measure a transfer function;
    determining a Parent-Only-Path of nodes from the output node to the input node;
    modifying a directly coupled resistance or a directly coupled capacitance of a node within the POP;
    recalculating the effective capacitance and the effective transfer function values for the modified RC node;
    recalculating the effective capacitance and the effective transfer function values of the parent node of the modified node as a function of the recalculated effective capacitance and the recalculated effective transfer function of the modified RC node; and
    storing the effective capacitance and the effective transfer function values.

18. The method of 17, further comprising the step of recalculating the effective transfer function and the effective capacitance value of the input node as a function of the recalculated effective capacitance and the recalculated effective transfer function of a directly coupled child RC node.

19. The method of 17, wherein the effective capacitances and the effective transfer functions of a plurality of RC nodes of the POP are recalculated.

20. The method of 17, wherein the modified RC node is the input RC node.

21. The method of 17, wherein every node disposed between the input RC node and the modified node of the POP has an effective capacitance and an effective transfer function that is a function of the modified effective capacitance and the effective transfer function values of a directly coupled child node or nodes.

22. The method of 17, wherein only the recalculation of the effective transfer functions of the nodes of the Parent-Only-Path is necessary for incremental changes between an input node and an output node.

23. A computer program product having a medium with a computer program embodied thereon, which when executed, determines and calculates values associated with a node or nodes of a simulated RC network, the computer program comprising:
    computer code for determining a count of normalized frequency points;
    computer code for calculating a normalized frequency interval between two of the normalized frequency points;
    computer code for calculating the normalized frequency corresponding to the normalized frequency intervals;

computer code for employing two of the plurality of normalized frequencies to determine a transfer function of the simulated RC network; and computer code for analyzing the simulated RC network based on the determined transfer function.

24. A processor including a computer program, which when executed stores quantities in a node or nodes of a simulated RC network, the computer program comprising:

computer code for selecting a node of the simulated RC network;

computer code for calculating an effective capacitance for the selected node, wherein the effective capacitance is calculated through the employment of one or more transfer functions, wherein the one or more transfer functions are a function of a geometric sampling;

computer code for calculating an effective transfer function for the selected RC node, wherein the effective transfer function is calculated through the employment of the effective capacitance of the selected node; and computer code for storing information associated with the selected RC node wherein the effective capacitance and effective transfer function values are stored.

\* \* \* \* \*